(12) United States Patent
Smaini et al.

(10) Patent No.: US 7,738,597 B2
(45) Date of Patent: Jun. 15, 2010

(54) FREQUENCY TRANSPOSITION METHOD AND DEVICE, IN PARTICULAR FOR THE CONTROL OF THE TRANSMISSION POWER OF A CELLULAR MOBILE TELEPHONE

(75) Inventors: Lydi Smaini, St. Julien en Genevois (FR); Patrick Cerisier, Copponex (FR); Philippe Gouessant, La Garenne Colombes (FR)

(73) Assignee: STMicroelectronics, Amsterdam (NL)

( * ) Notice: Subject to any disclaimer, the term of this patent is extended or adjusted under 35 U.S.C. 154(b) by 1529 days.

(21) Appl. No.: 11/053,179

(22) Filed: Feb. 8, 2005

(65) Prior Publication Data
US 2005/0190846 A1 Sep. 1, 2005

(30) Foreign Application Priority Data
Feb. 10, 2004 (EP) .................................. 04290333

(51) Int. Cl.
*H03K 9/00* (2006.01)
(52) U.S. Cl. .................... 375/316; 332/103; 455/255
(58) Field of Classification Search ................ 332/103, 332/149, 151; 375/316; 455/255, 318, 323
See application file for complete search history.

(56) References Cited
U.S. PATENT DOCUMENTS

| | | | | |
|---|---|---|---|---|
| 5,534,827 A * | 7/1996 | Yamaji | ........................ | 332/103 |
| 5,675,392 A * | 10/1997 | Nayebi et al. | ................ | 348/584 |
| 6,324,388 B1 * | 11/2001 | Souetinov | .................... | 455/302 |
| 6,339,621 B1 * | 1/2002 | Cojocaru et al. | ............ | 375/247 |
| 6,882,834 B1 * | 4/2005 | Balboni | ....................... | 455/255 |
| 7,460,849 B2 * | 12/2008 | Gard et al. | ................... | 455/318 |
| 2002/0060597 A1 * | 5/2002 | Storm Rokos | .............. | 327/317 |
| 2004/0208271 A1 * | 10/2004 | Gruenberg et al. | .......... | 375/355 |

FOREIGN PATENT DOCUMENTS

EP        0 740 422        10/1996

OTHER PUBLICATIONS

Patent Abstracts of Japan, vol. 1998, No. 12, Oct. 31, 1998; and JP 10 190509, NEC Corp., Jul. 21, 1998.
European Search Report, EP 04 290333, dated Jun. 8, 2004.

* cited by examiner

*Primary Examiner*—David C Payne
*Assistant Examiner*—Leon-Viet Q Nguyen
(74) *Attorney, Agent, or Firm*—Gardere Wynne Sewell LLP

(57) ABSTRACT

A frequency transposition device including an input terminal for receiving an incident signal SI and a modulator of the one-bit delta-sigma type MDU connected to the input terminal. A generator MGN provides a periodic auxiliary signal SAX with a frequency equal to a desired transposition frequency. A frequency transposer of the Gilbert cell type has a signal input BES connected to the output of the generator, a control input BCO connected to the output of the delta-sigma modulator MDU, and an output BS delivering a transposed signal STR.

5 Claims, 5 Drawing Sheets

FREQUENCY TRANSPOSITION METHOD AND DEVICE, IN PARTICULAR FOR THE CONTROL OF THE TRANSMISSION POWER OF A CELLULAR MOBILE TELEPHONE

PRIORITY CLAIM

This application claims priority from European Application for Patent No. 04290333.6 filed Feb. 10, 2004, the disclosure of which is hereby incorporated by reference.

BACKGROUND OF THE INVENTION

1. Technical Field of the Invention

The present invention relates to frequency transposition and applies advantageously to, but is not limited to, the field of radiofrequency communications, for example mobile telephone applications, in which the radiofrequency circuits make extensive use of frequency transposition devices, or frequency mixers, both in transmission and reception.

2. Description of Related Art

In transmission, the purpose of the frequency mixers, which in this case are frequency upshift circuits, is to transpose the information from the baseband to around the transmission carrier.

FIG. 1 illustrates schematically the usual structure used for frequency transposition devices of the prior art.

In the top part of FIG. 1, the reference MIX denotes a frequency transposition means, or mixer (here a frequency upshifter), having an input terminal BES for receiving an incident signal SI, for example in the baseband or at an intermediate frequency. The mixer MIX also has a control terminal BCO for receiving a local oscillator signal LO, for example around 2 GHz in a mobile telephone application using CDMA (Code Division Multiple Access) systems. The mixer MIX further includes an output terminal BS for delivering the output signal STR that is a transposed signal whose frequency spectrum is situated around the fundamental frequency of the local oscillator signal and odd number rank harmonics. The amplitude of these harmonics decreases proportionally to their rank number, in other words they decrease, in decibels, with a slope of −20 dB per decade.

Thus, in practice, the mixer MIX is followed by a bandpass filter centered around the fundamental frequency of the local oscillator, such that only the part of the spectrum centered around this fundamental frequency is conserved.

The usual structure used for these mixers is a generally differential structure of the Gilbert-cell-type such as is illustrated schematically in the middle part of FIG. 1.

Such a cell is well known to those skilled in the art and only its essential features are recalled here.

More precisely, such a cell comprises a differential transducer block BTC for converting the input signal (voltage) present across the terminals BES into a differential current. Here, this block BTC comprises a stage formed by a differential pair of transistors whose respective bases are connected to the input terminals via two capacitors. The collectors of the two transistors of this stage form the output terminals of this transducer block BTC. The block BTC can, of course, comprise several stages.

The transistors of the stage of the block BTC are biased by conventional biasing means MPL notably comprising resistors together with a voltage source.

A current switching block BCC is connected to the output of the transducer block BTC, in other words to the collectors of the transistors of this block BTC. The switching block BCC alternately routes the current towards one or the other of the two output terminals BS at the frequency of the local oscillator signal LO received at the terminals BCO. This block BCC conventionally comprises two pairs of transistors.

Each resistor ZL, connected between the output terminals BS of the block BCC and the power supply Vcc, represents the output load of the mixer MIX.

The block BTC converts the power or the voltage applied to the input BES into a differential current that is an image, assumed to be linear, of the input signal. This linear signal is then chopped by a non-linear square function (+1, −1, +1, −1 . . . ), produced by the two-way switch BCC, at the frequency of the signal LO, this two-way switch acting as a dynamic current router. The output signal is acquired across the terminals of the differential load 2ZL.

In other words, as also illustrated schematically in the lower part of FIG. 1, the signal STR present at the output terminal BS of the mixer MIX corresponds to the incident signal SI multiplied by +1 (or non-inverted) and then −1 (or inverted) at the rhythm of the local oscillator periodic signal LO, generally amplitude limited at +1 and −1.

Thus, in such a conventional mixer, the control input, or local oscillator input, receives a periodic transposition signal (local oscillator signal) having the desired transposition frequency and with a fixed level of power necessary to drive the transistors of the switching block BCC of the Gilbert cell.

Moreover, the power of the transposed signal is, neglecting losses, equal to the power of the incident signal.

Under these conditions, and with the assumption that a low power incident signal is available which needs to be transmitted, after transposition, with a high power, it is then necessary to carry out a signal amplification which generally comprises an amplification of the incident signal before transposition and an amplification after transposition.

However, where high amplification of the incident signal is necessary in some applications, for example in mobile telephones, this turns out to be particularly difficult to achieve since the linearity of the incident signal needs to be preserved during the amplification so as not to lose information during the mixing (transposition) process.

A need accordingly exists to provide a solution to this problem.

SUMMARY OF THE INVENTION

In accordance with an embodiment of the present invention, a frequency transposition system integrates, in some manner, an amplification function that does not affect the linearity of the incident signal to be transposed.

In accordance with another embodiment of the present invention, control is exercised over the transmission power of a signal transmitted by a component of a wireless communication system, for example a cellular mobile telephone.

In an embodiment of the present invention, a method for the frequency transposition of an incident signal is presented wherein a modulation of the incident signal of the delta-sigma type over one bit is performed so as to generate a binary signal that is representative of the incident signal. A periodic auxiliary signal is generated with a frequency equal to the desired transposition frequency. A succession of inversions and non-inversions of the auxiliary signal controlled by the successive states of the binary signal are then made so as to generate a transposed signal.

Thus, according to the invention, the usual signal input of a mixer here does not receive the incident signal to be transposed, as in the prior art, but instead receives a periodic auxiliary signal, or carrier signal, with a frequency equal to the desired transposition frequency (this signal is therefore the transposition signal), while the usual control input of a mixer does not receive the transposition signal (local oscillator signal) as is the case in the prior art, but instead receives a binary signal (in other words, encoded over two states +1 and −1, for example) originating from a modulation of the 1-bit delta-sigma type of the incident signal.

Accordingly, the output signal power then depends not only on the incident signal power, but also on the amplitude of the auxiliary signal.

Furthermore, the question of the linearity of the signals in the case of high power is not critical here according to the invention, since there is no loss of information from the incident signal. Indeed, although it has a constant amplitude, the signal at the output of the delta-sigma modulator contains all the information from the input signal (amplitude and phase) encoded in the time axis. Thus, the delta-sigma modulator allows the signal to be encoded with one bit while, at the same time, rejecting the quantizing noise outside of the useful band of the signal.

It is, moreover, particularly advantageous that the amplitude of the auxiliary signal be variable, since this then allows an adjustment of this amplitude depending on the desired power for the transposed signal.

In another embodiment of the invention, a frequency transposition device is presented which comprises an input terminal for receiving an incident signal and a modulator of the one-bit delta-sigma type connected to the input terminal. Means operate to generate a periodic auxiliary signal with a frequency equal to the desired transposition frequency. Frequency transposition means of the Gilbert cell type having a signal input connected to the output of the generation means and a control input connected to the output of the delta-sigma modulator operate to deliver a transposed signal at an output.

According to one embodiment of the invention, the amplitude of the auxiliary signal is variable and the device then also comprises means for adjusting this amplitude as a function of a desired power for the transposed signal.

The incident signal can be an analog or digital signal.

An embodiment of the present invention also proposes a component of a wireless communication system, for example a cellular mobile telephone, comprising a transmission channel comprising a digital processing stage delivering two baseband digital signals in quadrature, and an output amplifier stage. The transmission channel then comprises at least one frequency transposition device, as defined here above, disposed between the digital processing stage and the output amplifier stage.

An embodiment of the present invention also proposes a method for controlling the power of a signal transmitted by the transmission channel of such a component, this method comprising an adjustment of the amplitude of the auxiliary signal applied to the signal input of the frequency transposition device.

BRIEF DESCRIPTION OF THE DRAWINGS

Other advantages and features of the invention will become apparent upon examining the detailed description of the methods and embodiments of the invention, which are in no way limiting, and the appended drawings in which.

DETAILED DESCRIPTION OF THE DRAWINGS

Figure 1:
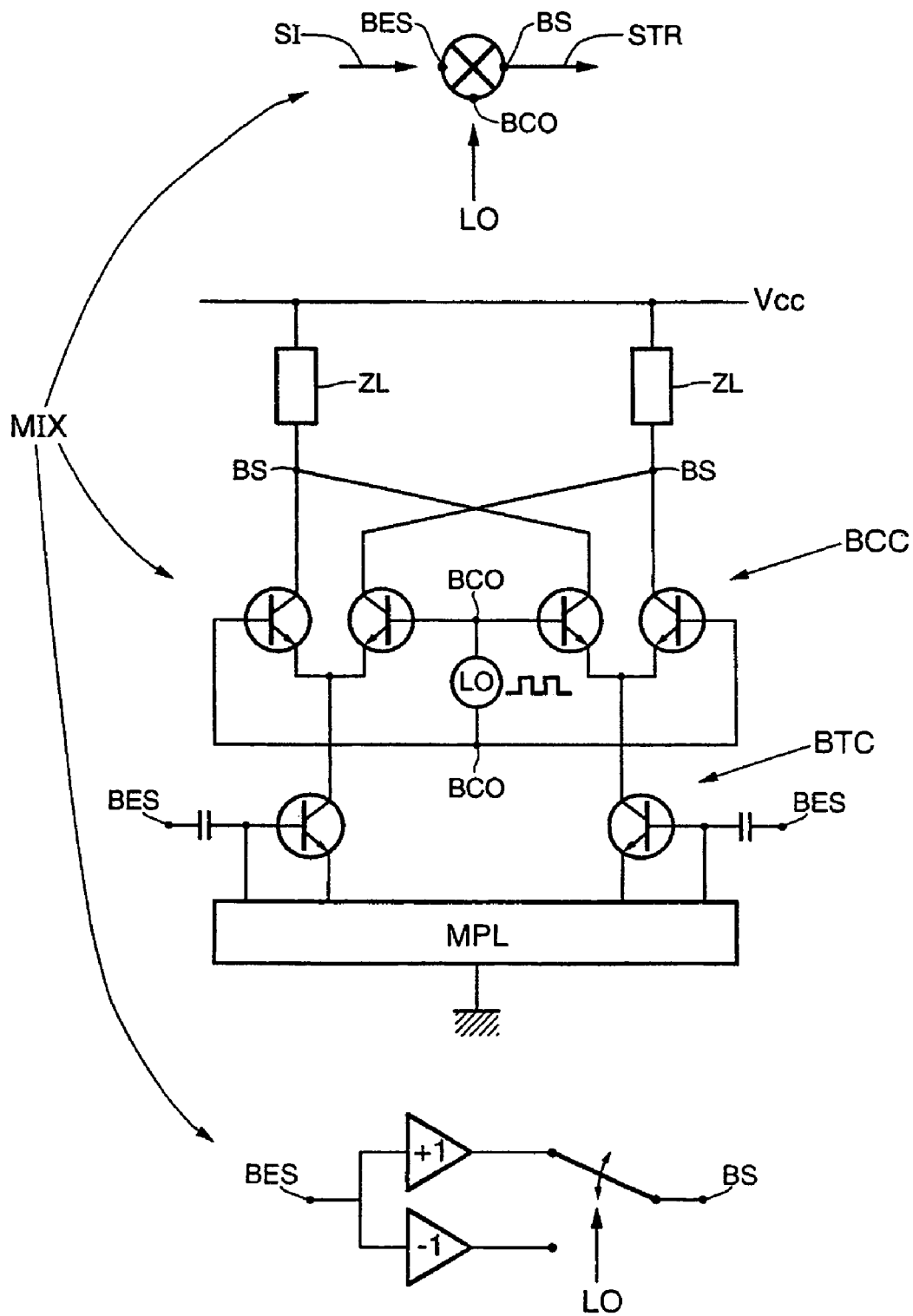
FIG. 1, already described above, illustrates a transposition means according to the prior art.
Figure 2:
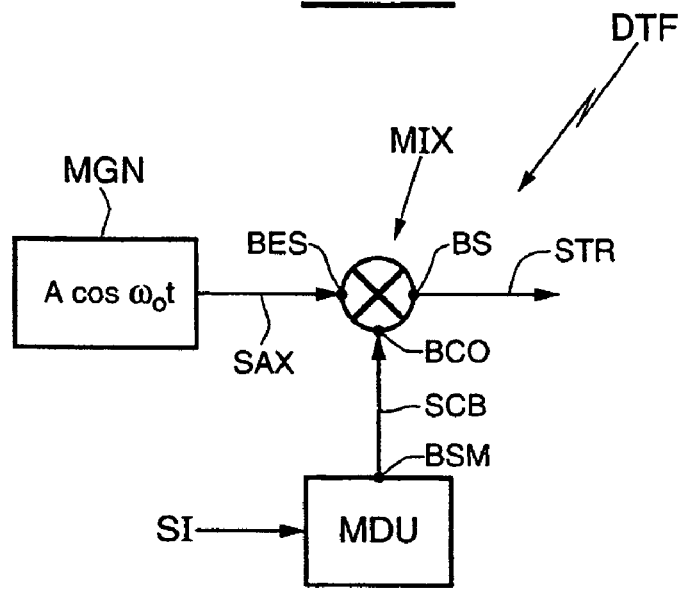
FIGS. 2 and 3 illustrate, very schematically, a frequency transposition device according to the invention.

In FIG. 2, the reference DTF denotes a frequency transposition device comprising a frequency transposition means or mixer MIX of, for example, the Gilbert cell type. Thus, the mixer MIX in FIG. 2 can be structurally identical to the mixer MIX in the middle part of FIG. 1.

This mixer MIX thus comprises a signal input BES, a control input BCO and an output BS delivering a transposed signal STR.

The frequency transposition device DTF also comprises generation means MGN capable of generating an auxiliary signal SAX. This auxiliary signal, or carrier signal, is a periodic signal having a frequency equal to the desired transposition frequency. In the present case, this auxiliary signal is a signal of the form $A\cos 2\pi f_0 t$, where $f_0$ denotes the transposition frequency ($\omega_0 = 2\pi f_0$).

The amplitude A of the auxiliary signal SAX is advantageously adjustable and its adjustment will allow the output signal power to be varied, in other words the power of the transposed signal STR.

Such generation means are of conventional structure and known per se.

The device DTF further includes a modulator of the delta-sigma type, with reference MDU, receiving the incident signal to be transposed SI as input and delivering as output, at its terminal BSM, a binary signal (i.e., with two states, for example +1 and −1), that is representative of the incident signal SI. In other words, owing to the delta-sigma modulation over 1 bit, the signal SCB delivered as output from the modulator MDU has a constant amplitude and contains all the information from the input signal SI, both in amplitude and phase, this information being encoded over the time axis. Furthermore, the delta-sigma modulator not only allows the signal SI to be encoded over 1 bit, but also allows the quantization noise outside of the useful band of the incident signal SI to be rejected.

Although the mixer MIX is, for example, structurally identical to a mixer of the prior art, the nature of the signals it receives at its two inputs, namely the signal input on the one hand and the control input on the other, is totally different and unusual with respect to the mixer of the prior art.

More precisely, whereas the signal input of a mixer in the prior art receives the signal to be transposed, the signal input BES of the mixer MIX according to the invention here receives the auxiliary signal, in other words the carrier signal, which will define the transposition frequency.

Furthermore, whereas in the prior art the control input receives the transposition signal, the mixer MIX according to the invention receives the binary encoded signal SCB, which originates from the signal to be transposed after delta-sigma modulation over 1 bit, at its control input BCO.

The signal STR, which is the transposed signal delivered at the output terminal BS of the mixer MIX, contains the spectrum of the incident signal SI transposed to around the transposition frequency $F_0$.

In addition, the output power of the signal STR depends not only on the power of the incident signal SI, but also on the amplitude A of the auxiliary signal SAX. Thus, it is possible to control the power of the signal STR by acting on the amplitude A of the carrier signal SAX.

Figure 3:
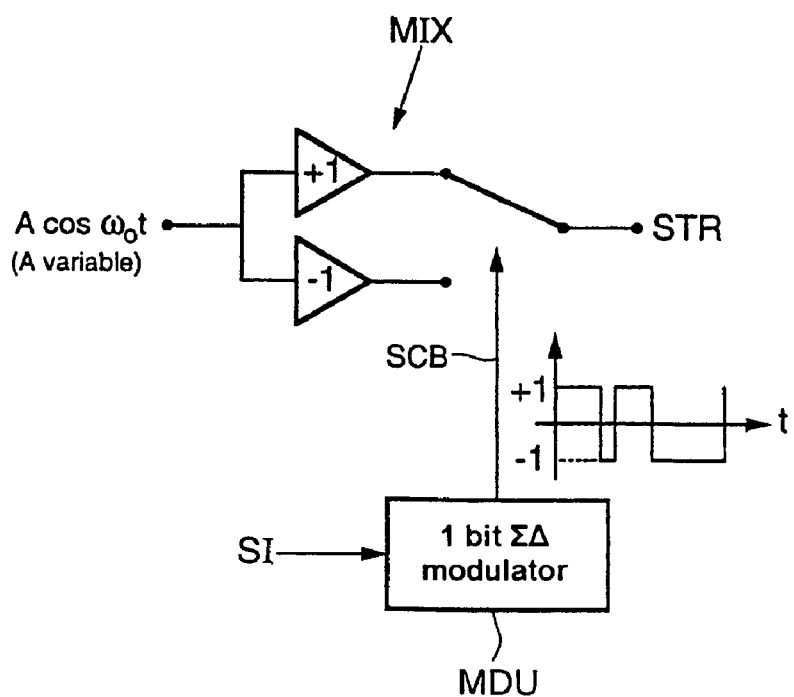

FIG. 3 illustrates another schematic diagram of the mixer MIX according to the invention. It can be seen that a succession of inversions and non-inversions are carried out on the auxiliary signal SAX (in other words, a succession of multiplications by +1 and by −1), this succession of inversions and non-inversions being controlled by the successive states of the binary signal SCB. Thus, for example, each time there is a +1 state for the signal SCB, a non-inversion of the signal SAX will be carried out, whereas the signal SAX will be inverted during a −1 state of the signal SCB.

Figure 4:
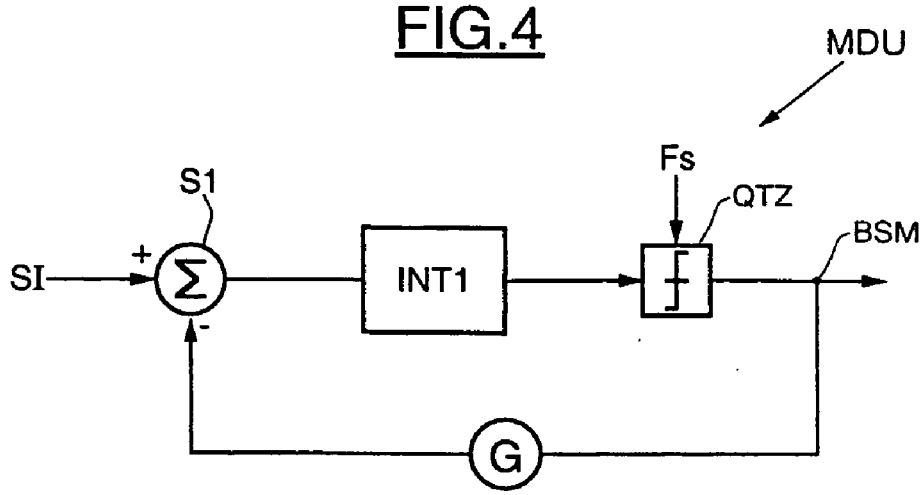
FIG. 4 illustrates schematically a 1-bit delta-sigma modulator incorporated into a frequency transposition device according to the invention.

The structure of a delta-sigma-type modulator is conventional and is well known to those skilled in the art. Its main features will be briefly recalled here with more particular reference to FIG. 4.

At its front end, the modulator MDU comprises an adder SI (subtractor) receiving the incident signal SI. Here, this subtractor is followed by an operator INT1 whose output is connected to the input of a quantization means QTZ (sampler) whose output forms the output of the modulator MDU. The output of the quantization means QTZ is fed back to the negative input of the adder SI via a gain G.

The "delta" modulation is based on the quantization of the modification of the signal from sample to sample, rather than on the quantization of the absolute value of the signal at each sample.

The presence of an integrator (sigma) within the modulator leads to the attribution of the name "delta-sigma" to the modulator.

The output of the delta-sigma modulator is at a very high oversampling frequency $F_S$. This is a fundamental characteristic of delta-sigma modulators because they use the high-frequency portion of the spectrum in order to push out the major part of the quantization noise.

Indeed, it is recalled that a delta-sigma modulator is designed to push the quantization noise outside of the useful signal band.

The delta-sigma modulator MDU described here is a modulator of order 1 because it only comprises a single subtractor and a single integrator. However, a delta-sigma modulator of higher order could be used. Furthermore, since the modulation is carried out over one bit, the quantization means here is a simple comparator that delivers two levels, +1 and −1, for example.

Finally, owing to the presence of an integrator, here the delta-sigma modulator is a low-pass delta-sigma modulator. However, the invention is also compatible with low-pass delta-sigma modulators that comprise a low-pass filter in place of an integrator. Although these modulators do not possess an integrator (sigma), they nevertheless retain the denomination "delta-sigma modulator" from misuse of language.

Figure 5:
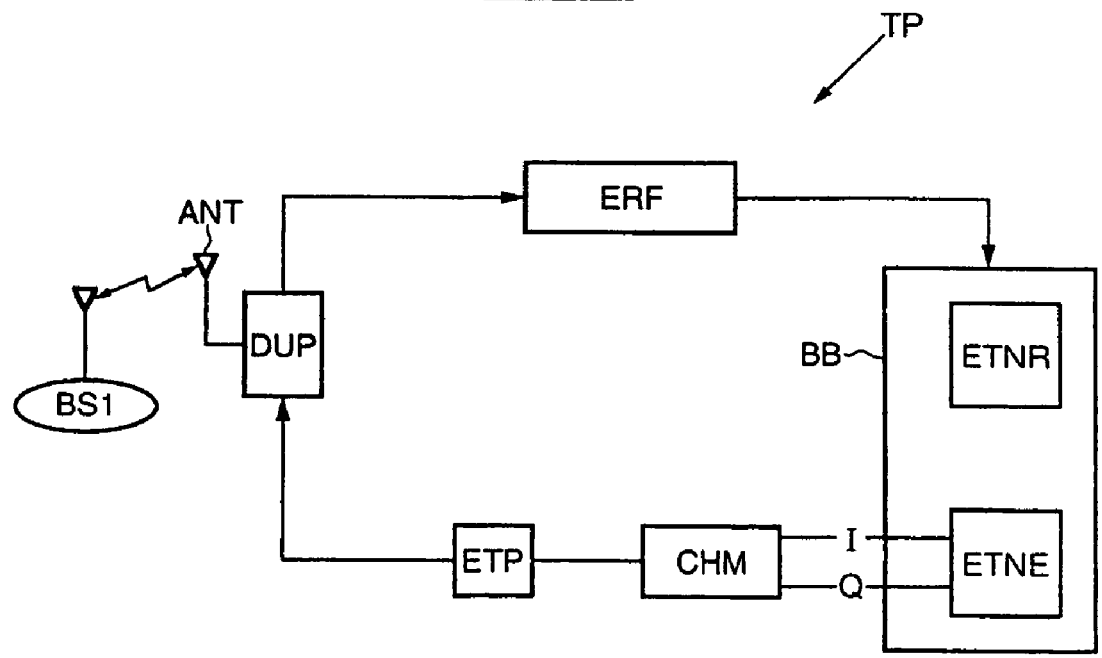
FIG. 5 illustrates schematically the structure of a cellular mobile telephone according to the invention, incorporating in its transmission channel at least one frequency transposition device according to the invention.

Referring more particularly to FIG. 5 and the following figures, an exemplary application of such a frequency transposition to a mobile telephone system will now be described.

In FIG. 5, the reference TP denotes a remote terminal, such as a cellular mobile telephone, which is in communication with a base station BS1, for example according to a communication protocol of the CDMA type.

The cellular mobile telephone conventionally comprises a radiofrequency analog stage ERF connected to an antenna ANT via a duplexer DUP for receiving an input signal.

Conventionally, the stage ERF comprises a low-noise amplifier and two processing channels comprising mixers, filters and conventional amplifiers. The two mixers respectively receive two signals with a 90° mutual phase difference from a phase-locked loop. After frequency transposition in the mixers, the two processing channels respectively define two streams, I (direct stream) and Q (quadrature stream), according to a denomination well known to those skilled in the art.

After digital conversion in analog/digital converters, the two streams I and Q are delivered to a reception processing stage ETNR that forms a part of a digital baseband processing module BB.

This processing stage ETNR conventionally comprises a receiver, commonly referred to as "Rake receiver" by those skilled in the art, followed by conventional demodulation means that carry out the demodulation of the constellation delivered by the Rake receiver.

The baseband processing block BB comprises, aside from the processing stages ETNR, a transmission processing stage ETNE that conventionally carries out, notably, processes for source encoding, symbol spreading, and modulation in order to deliver the two baseband streams I and Q to an analog transmission block CHM of conventional design. The block CHM is conventionally followed by a power amplification stage ETP connected to the antenna via the duplexer DUP.

In CDMA systems, and in particular WCDMA systems, in which the transmission and the reception are effected simultaneously, the power of the transmitted signal needs to be controlled over a wide range, typically around +80 dB, where the signal power must vary from −50 dBm to +24 dBm.

At the present time, this power control requires the use of several, generally variable, amplifying stages which is generally complex to implement, especially from the point of view of the amplification linearity.

The use of at least one frequency transposition device according to the invention in the transmission channel of a cellular mobile telephone allows this problem to be solved.

Figure 6:
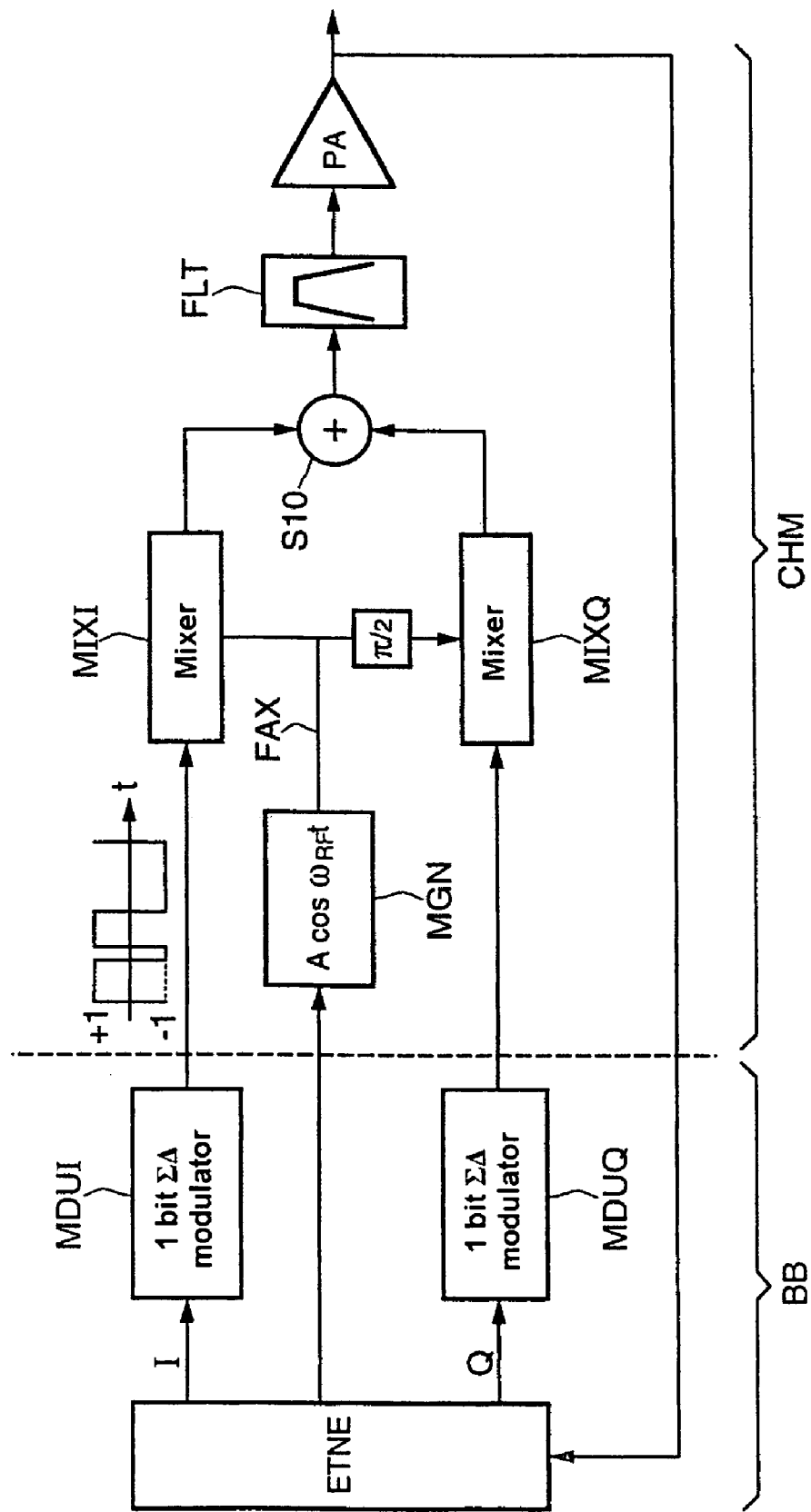
FIG. 6 illustrates, in more detail, one embodiment of the transmission channel of a cellular mobile telephone according to the invention.

More precisely, in FIG. 6, a low-pass, one-bit delta-sigma modulator, with reference MDUI, is connected to the output of the digital processing stage ETNE in the channel I within the baseband processing block BB.

Similarly, a one bit delta-sigma modulator MDUQ is connected to the output of the stage ETNE in the channel Q.

These two delta-sigma modulators are digital modulators, in other words the integration function and also the summation functions are implemented digitally.

The two baseband signals I and Q are therefore subject to a delta-sigma modulation over one bit and, after digital-to-analog conversion, they are respectively delivered to the control inputs of the two mixers MXI and MXQ.

Furthermore, the generation means for the auxiliary signal MGN delivers an auxiliary signal or carrier signal of the cosinusoidal type at a radiofrequency transposition frequency $F_{RF}$.

The auxiliary signal FAX (corresponding to the SAX signal of FIG. 2) is then delivered to the signal input of the mixer MIXI, and also to the signal input of the mixer MIXQ, following a phase shift of $\pi/2$.

The two signals transposed at the transposition frequency, originating respectively from the mixers MIXI and MIXQ, are summed in an adder S10, then the resulting signal is filtered in a low-pass filter FLT centered around the transposition frequency $F_{RF}$. The filtered signal is then delivered to an output amplifier PA of the amplification stage ETP.

Information relative to the power of the transmission signal at the output of the amplifier PA is sent to the digital processing stage ETNE and the processor incorporated within this stage can then adjust the amplitude A of the auxiliary signal FAX (SAX) depending on this information, so as to control the signal power at the output of the mixers and, consequently, the power of the transmission signal.

In the example of transmitter architecture in FIG. 6, the signals and Q originating from the baseband digital processing stage are encoded by low-pass, 1-bit delta-sigma modulators before being applied to the two quadrature mixers in order to transpose them to the transmission frequency. However, an example of architecture such as that illustrated in FIG. 7 can also be envisaged, in which an intermediate frequency stage is used, which can be implemented in either digital or analog technology, combined with the use of a low-pass 1-bit delta-sigma modulator.

Figure 7:
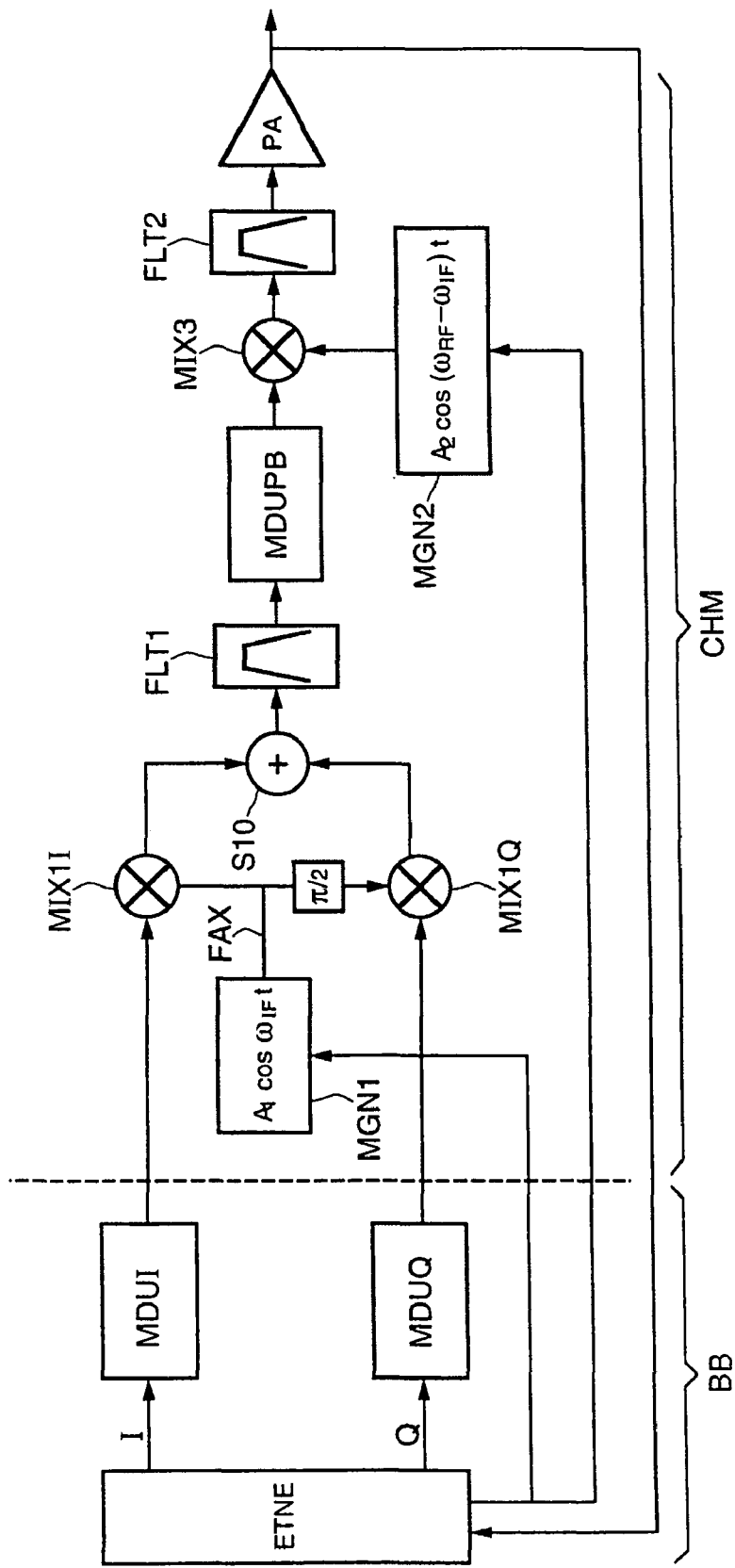
FIG. 7 illustrates schematically another embodiment of a transmission channel of a cellular mobile telephone according to the invention.

More precisely, as illustrated in FIG. 7, the signals and Q, originating from the stage ETNE, undergo a delta-sigma modulation in low-pass 1-bit delta-sigma modulators MDUI and MDUQ before being transposed in two mixers MX1I and MX1Q to an intermediate frequency $F_{IF}$ using a cosinusoidal carrier signal generated by first generation means MGN1.

The two transposed signals thus obtained are summed in an adder S10, then the summed signal is filtered in a first low-pass filter FLT1 centered around the intermediate frequency FIF.

The filtered signal then undergoes a 1-bit delta-sigma modulation in a modulator MDUPB which is a bandpass 1-bit delta-sigma modulator.

The modulated signal is applied to the control input of a mixer MIX3 which then transposes the signal to the radiofrequency transmission frequency $F_{RF}$ using a cosinusoidal carrier signal, with a frequency $F_{RF}$-$F_{IF}$, applied to the signal input of the mixer MIX3.

The output of the transposed signal is filtered in a second bandpass filter FLT2 centered around the radiofrequency transmission frequency $F_{RF}$, before being amplified by the output amplifier PA.

Here again, the transmission power of the output signal is sent to the digital processing stage ETNE, such that the baseband processor can act, where necessary, on the generation means MGN1 and MGN2 so as to adjust the amplitude A1 of the first carrier signal and/or the amplitude A2 of the second carrier signal.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A frequency transposition device, comprising:
   an input terminal for receiving an incident information data signal, the incident information data signal having a spectrum;
   a modulator of the one-bit delta-sigma type connected to the input terminal and generating a binary data signal;
   a generator of an analog cosine auxiliary local oscillator signal with a frequency equal to a desired transposition frequency; and
   a frequency transposer of the Gilbert cell type having a data signal input connected to receive the analog cosine auxiliary local oscillator signal output from the generator, a local oscillator control input connected to receive the binary data signal output from the delta-sigma modulator, and an output delivering a transposed signal, the frequency transposer including a circuit that inverts with negative multiplication and does not invert with positive multiplication the received analog cosine auxiliary local oscillator signal in response to corresponding logic states of the received binary data signal to frequency transpose the spectrum of the incident information data signal to around the desired transposition frequency;
   wherein the Gilbert cell type frequency transposer comprises:
     a first transistor with a first current path and a first control terminal coupled to the data signal input receiving the analog cosine auxiliary local oscillator signal;
     a second transistor with a second current path and a second control terminal coupled to the data signal input receiving the analog cosine auxiliary local oscillator signal;
     third and fourth transistors with corresponding third and fourth current paths connected to the first current path, the third and fourth transistors coupled to the local oscillator control input receiving the binary data signal;
     fifth and sixth transistors with corresponding fifth and sixth current paths connected to the second current path, the fifth and sixth transistors coupled to the local oscillator control input receiving the binary data signal; and
     a cross-coupling of the fourth and fifth current paths to the sixth and third current paths, respectively.

2. The device according to claim 1, wherein an amplitude of the analog cosine local oscillator signal at the desired transposition frequency is variable and further including means for adjusting this amplitude to set a desired power for the frequency transposed signal at the desired transposition frequency.

3. The device according to claim 1, wherein the incident information data signal is one of an analog or digital signal.

4. The device of claim 1 wherein the desired transposition frequency is a radio frequency.

5. The device of claim 1 wherein the desired transposition frequency is an intermediate frequency.

* * * * *